United States Patent [19]

Arakawa et al.

[11] Patent Number: 4,752,736
[45] Date of Patent: Jun. 21, 1988

[54] CENTER FED QD MRI RF COIL

[75] Inventors: Mitsuaki Arakawa, Hillsborough; Lawrence E. Crooks, Richmond; William H. Harrison, Malibu, all of Calif.

[73] Assignee: The Regents of the University of California, Berkeley, Calif.

[21] Appl. No.: 888,074

[22] Filed: Jul. 22, 1986

[51] Int. Cl.⁴ ............................................. G01R 33/20
[52] U.S. Cl. ..................................... 324/318; 324/322
[58] Field of Search ............... 324/316, 318, 322, 300, 324/307

[56] References Cited

U.S. PATENT DOCUMENTS

| | | | |
|---|---|---|---|
| 4,638,253 | 1/1987 | Jaskolski et al. | 324/322 |
| 4,649,348 | 3/1987 | Flugan | 324/322 |
| 4,692,705 | 9/1987 | Hayes | 324/322 |

OTHER PUBLICATIONS

*Journal of Magnetic Resonance* 54, 324–327, 1983, "Quadrature Detection Coils–A Further √2 Improvement in Sensitivity" by C. N. Chen, D. I. Hoult and V. J. Sank in Journal of Magnetic Resonance 54, 324–327 (1983).

"Quadrature Detection in the Laboratory Frame "by D. I. Hoult, C. N. Chen and V. J. Sank in Magnetic Resonance in Medicine I, 339–353 (1984).

"A Quadrature Probe for Adult Head NMR Imaging" by V. J. Sank, C. N. Chen and D. I. Hoult in Department of Radiology, Clinical Center Biomedical Engineering and Instrumentation Branch—pp. 650–651.

"Radio Frequency Penetration Effects in MR Imaging: Simulation/Experiment with Linearly Polarized and Circularly Polarized RF Fields" by G. H. Blover et al.—pp. 264–265.

"An in Vivo NMR Probe Circuits for Improved Sensitivity" by Joseph Murphy-Boesch and Alan P. Koretsky—Journal of Magnetic Resonance 54, 526–532 (1983).

*Primary Examiner*—Stewart J. Levy
*Assistant Examiner*—Lawrence G. Fess
*Attorney, Agent, or Firm*—Nixon & Vanderhye

[57] ABSTRACT

A quadrature detection MRI radio frequency coil includes plural axially-extending conductive legs. At least two of the legs include breaks in conductivity at their mid-point with circumferentially extending innerbridge conductors connected thereacross to which RF input/output feed connections are conveniently made so as to achieve a center fed coil structure, open at both ends. Other axially-extending legs may also include conductive breaks with capacitive coupling thereacross and circumferentially extending outer-bridges between the outer or distal ends of the legs may also include breaks in conductivity with capacitive coupling thereacross.

10 Claims, 3 Drawing Sheets

CENTER FED QD MRI RF COIL

SPECIFICATION

This invention is related to the field of magnetic resonance imaging (MRI) utilizing nuclear magnetic resonance (NMR) phenomena. It is particularly related to an advantageous center-fed quadrature-detection (QD) radio fequency (RF) coil for such an apparatus.

CROSS-REFERENCE TO RELATED APPLICATIONS

This application is generally related to earlier filed, commonly assigned, patents and applications of Crooks et al including U.S. Pat. Nos. 4,297,637; 4,318,043; 4,471,305; pending application Ser. No. 515,177 filed July 19, 1983 (now U.S. Pat. No. 4,599,565); the pending application to Crooks Ser. No. 515,116 filed July 19, 1983 (now U.S. Pat. No. 4,607,225); the pending application to Arakawa et al Ser. No. 827,609 filed Feb. 10, 1986 (now allowed); and the pending application to Harrison et al Ser. No. 827,638 filed Feb. 10, 1986 (now U.S. Pat. No. 4,682,125) and the copending application of Fehn et al filed June 25, 1986, Ser. No. 878,369 (now allowed). The contents of these referenced related patents and/or patent applications are hereby incorporated by reference.

BACKGROUND OF THE INVENTION

Magnetic resonance imaging (MRI) is now coming into wide-spread commercial usage. Nevertheless, there are still many possible areas for improvement. For example, desired improvements are still sought to improve the signal-to-noise ratio in NMR responses and, accordingly, in resulting NMR images.

One presiously known technique for improving the attainable signal-to-noise ratio involves the use of quadrature RF transmit/receive coils. For example, a general description of such quadrature RF coils and of the potential benefits to be derived from use of same is provided in the following prior publications:

"Quadrature Detection Coils—A Further $\sqrt{2}$ Improvement in Sensitivity" by Chen et al, J. Mag. Res. 54, 324–327 (1983)

"Quadrature Detection in the Laboratory Frame" by Hoult et al, Mag. Res. Med. 1 339–353 (1984)

"A Quadrature Probe For Adult Head NMR Imaging" by Sank et al, Department of Radiology, NIH, Proceedings of the Third Annual Meeting of the Society of Magnetic Resonance in Medicine, New York, August 1984, pp 650–651

"Radio Frequency Penetration Effects in MR Imaging: Simulation/Experiment with Linearly Polarized and Circularly Polarized RF Fields" by Glover et al, GE Medical Systems, Proceedings of the Third Annual Meeting of the Society of Magnetic Resonance in Medicine, New York, August 1984, pp 264–265.

(The above-referenced Arakawa et al pending application Ser. No. 827,609 and Fehn et al (UC 86-044-1) also specifically relate to quadrature detection RF coils for MRI.)

These prior publications describe a pair of matched quadrature RF coils wherein each coil includes four axially extending legs disposed at 60°, 120°, 60° and 120° intervals about a common cylinder—with one coil being rotated by 90° spatially with respect to the other. (It is possible that some other reported QD coils use axial legs disposed at equal 90° intervals.) Quadrature phase outputs from the two separate coils are subsequently combined in a 90° hybrid so as to produce an output having increased signal-to-noise ratio (e.g., because the non-coherent noise will tend to cancel when the two signals are coherently added with an appropriate 90° phase shift in one of them). As is also noted in these references, one or both of the coils may be advantageously utilized for transmitting RF NMR excitation pulses into the enclosed volume to be imaged so as to further enhance the RF field uniformity and/or so as to reduce the required level of transmitted RF power.

Ideally, there should be no inductive coupling between the two RF quadrature coils. In reality, there is always inherently some spurious coupling. Nevertheless, the effective isolation between the two coils can be improved by purposefully adding some additional coupling between the coils of the proper amplitude and phase to cancel (or at least substantially reduce) the unwanted but inherent spurious inter-coil coupling. It is apparently for this purpose that the prior art has employed conductive areas (termed "paddles") between some sections of the coil legs.

Although the general theory of quadrature detection coils is known in the prior art, the successful realization of a commerically reproducible working embodiment of such a system with minimum coupling between the coils, an RF balanced coil structure—and one which is nevertheless configured spatially in a manner which facilitates not only manufacture but also actual use—remains as a difficult task.

Some prior approaches have employed coil structures having both ends of the coil structure open-ended and with axially extending feedlines emanating from opposite ends of the overall structure and respectively associated with each of the two coils.

The earlier-referenced related Arakawa et al application Ser. No. 827,609 discloses an improved and novel structure for quadrature RF coil arrangement in an MRI apparatus which provides very good isolation between the two coils even though only one end of the coil is open-ended (e.g., so as to accept a head or other object to be imaged) while the other end of the structure is "closed" for convenient location of RF coupling and feeding structures. This novel arrangement includes a special perpendicular arrangement of respectively associated RF feedline structures extending across perpendicular diameters of the common closed end. Pairs of coil legs in each of the coil structures are capacitively coupled together at the open end and conductively coupled together at the closed end (where they are conductively coupled to a respectively associated one of the perpendicular feedline structures).

The earlier referenced Fehn et al application discloses a technique for achieving quadrature detection with a pair of surface coils (which, in the exemplary embodiment, may also be center fed in accordance with the present invention).

SUMMARY OF THE INVENTION

We have now discovered a technique for achieving RF input/output feed connection to a center portion of a quadrature detection MRI RF coil structure. Such a center-fed arrangement permits one to leave both ends of the coil structure open (e.g., so as to freely pass over and along an object to be imaged) without requiring awkward (and perhaps otherwise disadvantageous) widely separated RF feedpoints for the two QD coils (e.g., as when each coil is fed from an opposite end of the composite QD coil structure).

In the exemplary embodiment, the QD coil structure uses substantially identical first and second co-located RF coils extending axially and circumferentially about a volume to be imaged but being rotationally offset with respect to one another so as to produce a pair of RF signals from the volume which are in quadrature phase. (As those in the art will appreciate, due to the theorem of reciprocity, the same advantageous signal-to-noise power ratio improvement during reception may be expected for excitation power in the transmit mode.)

Each of the RF coils in the exemplary embodiment includes the usual set of four axially extending legs (e.g., disposed at circumferential displacements of 60°, 120°, 60° and 120°, respectively). However, at least two adjacent ones of the legs have breaks in conductivity at their mid-points with circumferentially extending conductively connecting inner-bridges across the inner ends of this leg pair. RF input/output feed connections are then made conveniently across the resulting pair of inner-bridge conductors.

In the exemplary embodiment, the remaining axially extending legs of each coil structure also include a break in conductivity at their mid-point and coupling capacitance connected thereacross. The outermost or distal ends of the legs are also bridged by circumferentially extending conductive outer bridges (which may also include a break in conductivity midway therealong and coupling capacitance connected thereacross).

In addition, in the exemplary embodiment, additional isolation between the two coils of the composite QD coil structure is obtained by connecting an isolation capacitance between predetermined points of the two individual coil structures.

BRIEF DESCRIPTION OF THE DRAWINGS

These as well as other objects and advantages of this invention will be more completely understood and appreciated by carefully reading the following detailed description of a presently preferred exemplary embodiment of this invention, taken in conjunction with the drawings, of which.

DESCRIPTION OF THE PREFERRED EMBODIMENTS

Figure 1:
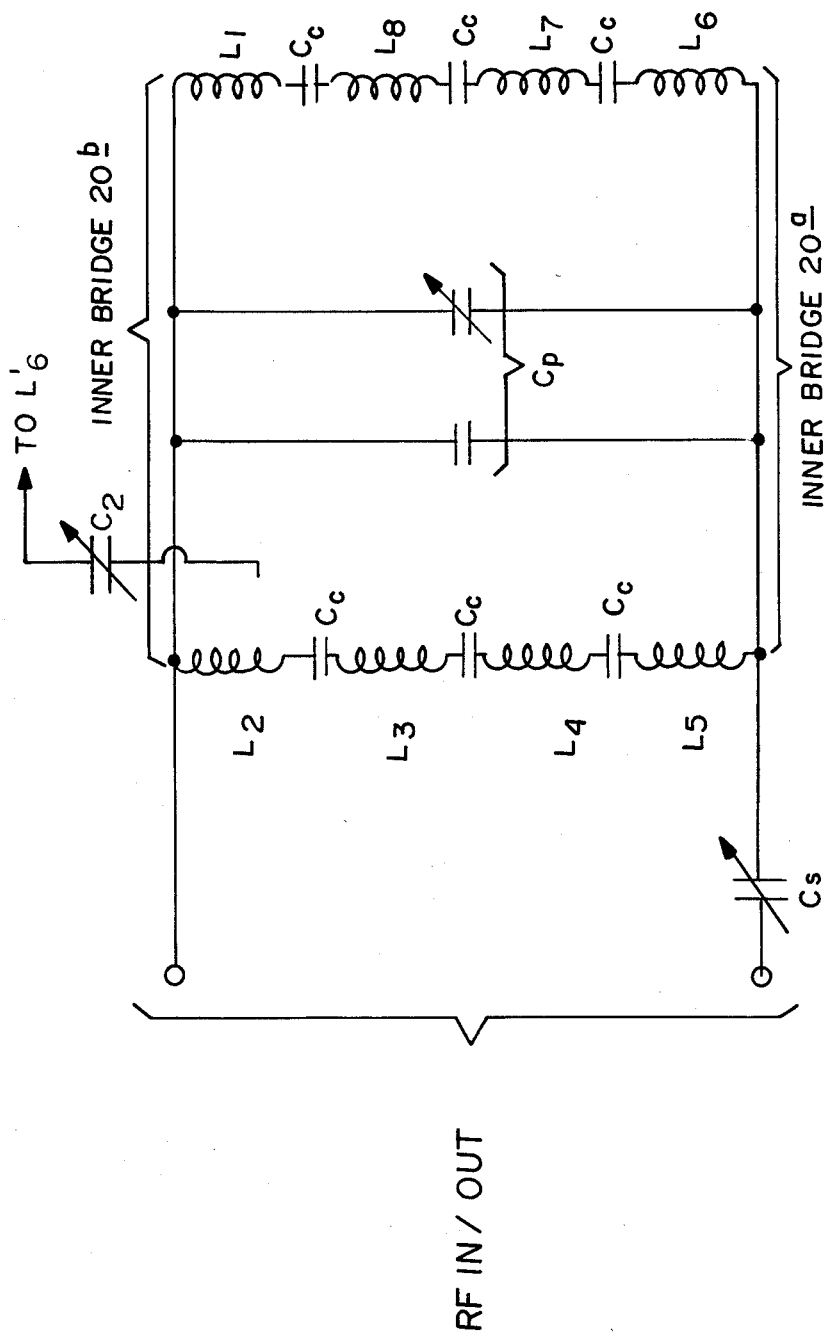
FIG. 1 is a lumped-parameter schematic circuit diagram of one of the pair of RF coils utilized in the composite QD coil structure of this invention.

Those in the art will recognize the lumped parameter circuit model of FIG. 1 as being quite similar to the traditional MRI RF coil structure. In particular, an RF input/output connection is made via a variable coupling capacitor $C_s$ (a similar series coupling capacitor may also be used in the other side of the input/output circuit if a truly balanced structure is required or desired) and a parallel tuning capacitance $C_p$ is employed so as to achieve a substantially matched RF feed connection at the desired frequency of operation.

Figure 2:
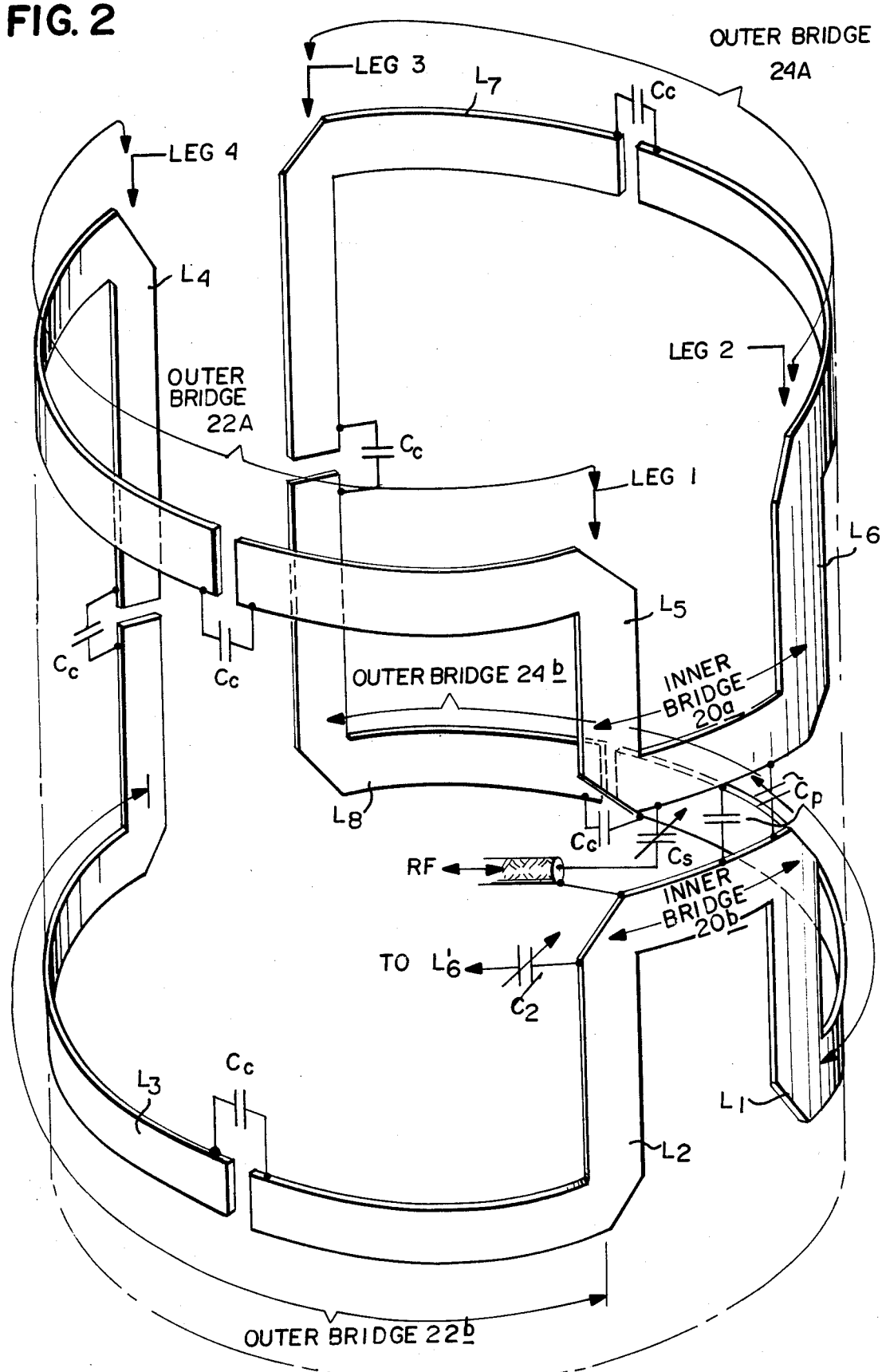
FIG. 2 is a perspective mechanical view of the shaped conductive straps comprising conductive segments L1–L8 in FIG. 1 and including a schematic showing of the coupling capacitances $C_c$, series coupling $C_s$, parallel tuning capacitance $C_p$ and isolating capacitance $C_2$.

In the exemplary embodiment, several different shaped conductive segments L1–L8 are interconnected either conductively (e.g., via conductive inner-bridges 20A, 20B as shown in FIG. 2) or via coupling capacitances $C_c$.

Although not depicted in FIG. 1, the second coil of the composite of the QD coil structure comprises an exactly similar arrangement where all corresponding structures are denoted by like reference numerals having a prime added to them. Thus, for example, in FIG. 1 an isolating capacitance $C_2$ is depicted as connected between conductive segment L2 and conductive segment L6' (which is itself not shown in FIG. 1 but which may be partially seen in FIG. 3). As will be appreciated, the isolating capacitance $C_2$ is prefereably connected between the individual QD coil structures at points which are substantially 180° out-of-phase so as to achieve even greater isolation between the individual QD coils.

So as to simplify and permit easier visualization of the basic coil structure involved, the eight shaped conductive segments L1–L8 for a single coil are shown in perspective at FIG. 2. As shown, the axially-extending portions of these conductive segments define four axially-extending conductive legs (leg 1, leg 2, leg 3 and leg 4). Each of the axially extending legs includes a break in conductivity at a midway point. The resulting inner ends of legs 1 and 2 are conductively bridged across by inner-bridges 20A and 20B as seen in FIG. 2. As a result, conductive segments L1 and L2 are actually connected together into a common single conductive segment as are L5 and L6. The inner-bridges 20A and 20B are thus located at the mid-point of the structure where it is convenient to connect the parallel tuning capacitance $C_p$ and also to effect an RF input/output connection (e.g., via coaxial cable and series coupling capacitance $C_s$). The conductive breaks at the mid-point of legs 3 and 4 also include capacitance coupling $C_c$ thereacross as depicted in FIG. 2.

The outer or distal ends of legs 1 and 4 are connected by a pair of circumferentially extending outer bridge conductors 22A, 22B while the outer or distal ends of legs 2 and 3 are similarly interconnected by conductive outer bridges 24A, 24B. In the exemplary embodiment, the outer bridges 22A, 22B, 24A, 24B also include breaks in conductivity at their mid-points across which a coupling capacitance $C_c$ is connected.

In the exemplary embodiment, the approximate diameter of the coil structure shown in FIG. 2 is 12 inches and the approximate axial length (center-to-center of the strap conductors) is 13 inches. The coupling capacitances $C_c$ (used only on the axially extending legs in this exemplary embodiment) are approximately 280 picofarads while the series input/output coupling capacitance $C_s$ is about 10–130 picofarads and the parallel tuning capacitance $C_p$ is about 460–580 picofarads. The conductive segments L1–L8 comprise approximately one inch wide strips of foil copper and collectively provide about 360 nH of inductance. Operation in the exemplary embodiment is at about 15 MHz.

As also shown in FIG. 2, an isolation capacitance $C_2$ is connected between predetermined points of segment 12 in the coil shown in FIG. 2 and segment L6' or L1' (as determined empirically) of a similar second coil structure rotated 90° (clockwise looking down from the top of FIG. 2) with respect to the structure shown in FIG.

2. The predetermined connection points and value of capacitance $C_2$ are chosen so as to maximize isolation between the two coil structures.

Figure 3:
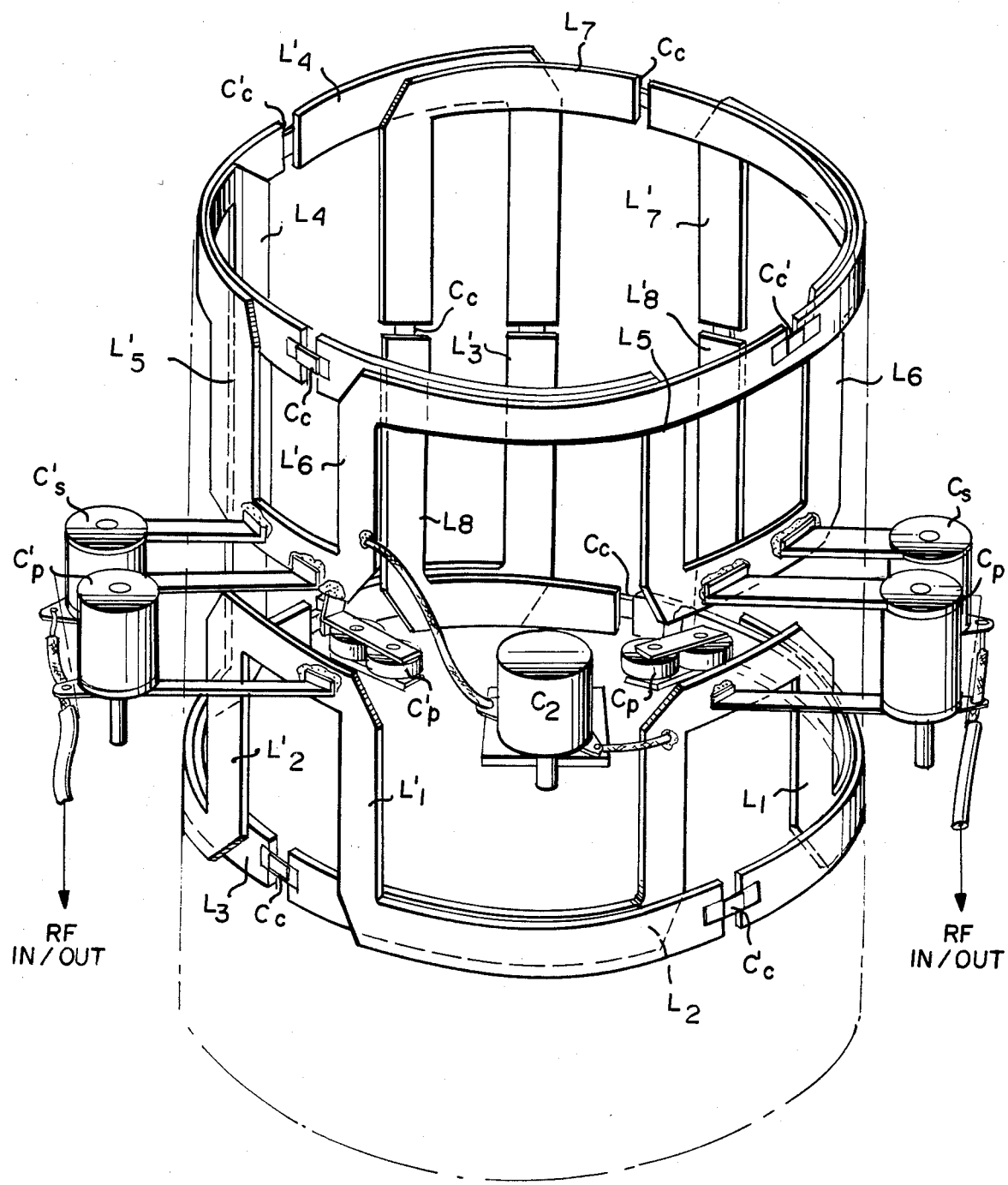
FIG. 3 is a perspective view of an exemplary composite QD MRI RF coil structure in accordance with this invention including a pair of individual RF coils such as that one depicted at FIGS. 1 and/or 2.

The composite QD magnetic resonance imaging RF coil structure of the exemplary embodiment is depicted in FIG. 3. As will be seen, it comprises two individual coils of the type shown in FIG. 2 with the second coil being rotated by 90° and with like elements having like reference numerals but having an added prime notation.

While only one exemplary embodiment has been described in detail, those skilled in the art will recognize that many variations and modifications may be made in this embodiment while yet retaining novel features and advantages of this invention. Accordingly, all such modifications and variations are to be included within the scope of the appended claims.

What is claimed is:

1. A quadrature detection magnetic resonance RF coil structure comprising:
   first and second co-located RF coils extending axially and circumferentially about a volume to be imaged but being rotationally offset so as to produce a pair of RF signals from said volume which are in quadrature phase;
   said first and second RF coils being open at both ends so as to pass over and along an object to be imaged;
   each of said coils including at least one pair of axially-extending conductive legs which each include a break in conductivity located midway along such legs and also including first and second innerconductive bridges circumferentially interconnecting respective ends of such breaks in conductivity and having an RF input/output feed connection made across said first and second innerconductive bridges.

2. A quadrature detection magnetic resonance imaging RF coil structure as in claim 1 wherein each of said coils comprises plural axially-extending conductive legs which include a break in conductivity located midway along the leg and having capacitive coupling thereacross.

3. A quadrature detection magnetic resonance imaging RF coil structure as in claim 2 wherein;
   each of said coils comprises four axially extending conductive legs, two of said legs being conductively joined to one another circumferentially at their midway break points whereat said feed connection is made, and
   each of said two legs also being circumferentially connected to another adjacent leg at their respective distal and opposite end points.

4. A quadrature detection magnetic resonance imaging RF coil structure as in claim 3 wherein said circumferential connections between distal end points of the legs each also include a break in conductivity located midway therealong and having capacitance coupling thereacross.

5. A quadrature detection magnetic resonance imaging RF coil structure as in claim 4 further comprising an isolation capacitive coupling connected between predetermined points of each coil.

6. A quadrature detection magnetic resonance imaging RF coil structure including first and second co-located RF coils extending axially and circumferentially about a volume to be imaged but being rotationally offset with respect to one another so as to produce a pair of RF signals from said volume which are in quadrature phase, each of said coils comprising:
   first, second, third and fourth axially extending legs of conductive material disposed at respectively corresponding predetermined circumferential locations, each leg having a pair of outer ends;
   said first and second legs having a conductive break located midway therealong and including a pair of circumferentially-extending conductive inner-bridges respectively interconnecting the resulting inner-ends of the first and second legs,
   RF input/output feed means being connected across said pair of inner-bridges,
   said outer ends of the first and fourth legs being interconnected by a first pair of circumferentially-extending conductive outer-bridges, and
   said outer ends of the second and third legs being interconnected by a second pair of circumferentially-extending conductive outer bridges;
   said legs and bridges all being formed of conductive material having substantially the same cross-sectional size and shape,
   each of said coils also including at least one further break in conductivity bridged by an RF bypass capacitance.

7. A quadrature detection magnetic resonance imaging RF coil structure as in claim 6 wherein said third and fourth leg each include a break in conductivity located midway therealong and capacitive coupling thereacross.

8. A quadrature detection magnetic resonance imaging RF coil structure as in claim 6 wherein each of said outer-bridges includes a break in conductivity located midway therealong and capacitive coupling thereacross.

9. A quadrature detection magentic resonance imaging RF coil structure as in claim 7 wherein each of said outer-bridges includes a break in conductivity located midway therealong and capacitive coupling thereacross.

10. A quadrature detection magnetic resonance imaging RF coil structure as in claim 6 further comprising isolation capacitance connected between predetermined portions of said first leg of one coil and of said second leg of the other coil.

* * * * *